US 8,723,143 B2

(12) United States Patent
Graupera et al.

(10) Patent No.: US 8,723,143 B2
(45) Date of Patent: *May 13, 2014

(54) PLASMA IGNITER FOR AN INDUCTIVELY COUPLED PLASMA ION SOURCE

(75) Inventors: Anthony Graupera, Hillsboro, OR (US); Sean Kellogg, Portland, OR (US); Tom Miller, Portland, OR (US); Dustin Laur, Forest Grove, OR (US); Shouyin Zhang, Portland, OR (US); Antonius Bastianus Wilhelmus Dirriwachter, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 27 days.

This patent is subject to a terminal disclaimer.

(21) Appl. No.: 13/276,731

(22) Filed: Oct. 19, 2011

(65) Prior Publication Data

US 2012/0032092 A1    Feb. 9, 2012

Related U.S. Application Data

(63) Continuation of application No. 12/710,602, filed on Feb. 23, 2010, now Pat. No. 8,124,942, which is a continuation-in-part of application No. 12/706,690, filed on Feb. 16, 2010, now abandoned.

(51) Int. Cl.
*G21G 5/00* (2006.01)

(52) U.S. Cl.
USPC ............... 250/492.1; 250/492.2; 250/423 R; 250/492.3; 250/424

(58) Field of Classification Search
USPC ....... 250/492.1, 492.2, 492.21, 492.3, 423 R, 250/424, 423 F
See application file for complete search history.

(56) References Cited

U.S. PATENT DOCUMENTS

| 7,241,361 | B2 | 7/2007 | Keller et al. |
| 7,670,455 | B2 | 3/2010 | Keller et al. |
| 2006/0086699 | A1 | 4/2006 | Holber et al. |
| 2009/0288772 | A1 | 11/2009 | Holber et al. |
| 2010/0044580 | A1 | 2/2010 | Boswell et al. |
| 2010/0126964 | A1 | 5/2010 | Smith et al. |
| 2011/0084207 | A1 | 4/2011 | Zhang et al. |

FOREIGN PATENT DOCUMENTS

| DE | 3842756 | 6/1990 |
| EP | 2341525 | 12/2010 |

OTHER PUBLICATIONS http://en.wikipedia.org/w/index.php?title=Bias_tee&oldid=290814579, May 18, 2009.

*Primary Examiner* — Robert Kim
*Assistant Examiner* — Hanway Chang
(74) *Attorney, Agent, or Firm* — Scheinberg & Assoc., PC; Michael O. Scheinberg

(57) ABSTRACT

A focused ion beam (FIB) system is disclosed, comprising an inductively coupled plasma ion source, an insulating plasma chamber containing the plasma, a conducting source biasing electrode in contact with the plasma and biased to a high voltage to control the ion beam energy at a sample, and a plurality of apertures. The plasma within the plasma chamber serves as a virtual source for an ion column comprising one or more lenses which form a focused ion beam on the surface of a sample to be imaged and/or FIB-processed. The plasma is initiated by a plasma igniter mounted near or at the column which induces a high voltage oscillatory pulse on the source biasing electrode. By mounting the plasma igniter near the column, capacitive effects of the cable connecting the source biasing electrode to the biasing power supply are minimized. Ion beam sputtering of the apertures is minimized by proper aperture materials selection.

18 Claims, 9 Drawing Sheets

US 8,723,143 B2

PLASMA IGNITER FOR AN INDUCTIVELY COUPLED PLASMA ION SOURCE

This application is a continuation of U.S. patent application Ser. No. 12/710,602, filed Feb. 23, 2010, which is a continuation-in-part of U.S. patent application Ser. No. 12/706,690, filed Feb. 16, 2010, both of which are hereby incorporated by reference.

TECHNICAL FIELD OF THE INVENTION

The present invention relates to plasma igniters for inductively coupled plasma sources used in ion beam columns.

BACKGROUND OF THE INVENTION

Inductively coupled plasma (ICP) sources have advantages over other types of plasma sources when used with a focusing column to form a focused beam of charged particles, i.e., ions or electrons. The inductively coupled plasma source, such as the one described in U.S. Pat. No. 7,241,361, which is assigned to the assignee of the present invention, is capable of providing charged particles within a narrow energy range, which allows the particles to be focused to a small spot. ICP sources include a radio frequency (RF) antenna typically wrapped around a ceramic plasma chamber. The RF antenna provides energy to maintain the plasma within the chamber.

The energy of ions used for ion beam processes is typically between 5 keV and 50 keV, and most typically about 30 keV. The electron energy varies between about 1 keV to 5 keV for a scanning electron microscope system to several hundred thousand electron volts for a transmission electron microscope system. The sample in a charged particle system is typically maintained at ground potential, with the source maintained at a large electrical potential, either positive or negative, depending on the particles used to form the beam. For the safety of operating personnel, it is necessary to electrically isolate the high voltage components.

It is usually not possible to ignite a plasma in an ICP source by injection of the normal power level of the RF power used to drive the coil of the ICP source. This is because, in the absence of any initial ionization in the source chamber, the induced electrical field is usually not high enough to break down the gas atoms or molecules to create sufficient initial free charges. To generate this initial ionization, typically a high voltage pulse is required. In the prior art, a high voltage pulse to ignite the plasma in the ICP ion source has been initiated by contacting a Tesla coil to an electrode which is itself in direct electrical contact with the plasma chamber. The high voltage pulse induced by the Tesla coil then initiates a plasma which is subsequently sustained by the RF power from the ICP power supply. This plasma ignition method necessarily requires that there be direct electrical contact between some exterior electrode on the system and the interior of the vacuum system where the plasma is to be ignited. However, when the plasma is biased to high voltage for use as the source in a charged particle beam system, such a direct electrical contact would present serious safety concerns since the external connection would float up to the plasma potential at high voltage. Thus, it is generally not possible to provide such a direct external electrical contact to the plasma in an ICP ion source which is biased to high voltage for use as the source in an ion beam system. This electrical isolation of the high voltage plasma thus creates a problem for igniting the plasma in an ICP source used to generate a charged particle beam.

SUMMARY OF THE INVENTION

An object of the invention is to provide a method for igniting a plasma in an ion beam system in which the ion source is biased to a high dc voltage.

This invention is particularly suitable for use with an inductively coupled plasma source. The igniter preferably provides ignition energy through a source biasing electrode in the plasma source, and the igniter is preferably located near the plasma source to minimize the effects of cable capacitance between the igniter and the column. In a preferred embodiment, the output of the plasma igniter is a repetitive oscillatory voltage pulse which is efficiently coupled into the plasma chamber through an electrode which will be in contact with the plasma once it is ignited. In some embodiments, the plasma igniter is housed in a high voltage safety enclosure and is biased by the same power supply which controls the energy of the ions emitted by the ICP plasma source.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

To generate this initial ionization, typically a high voltage pulse is required. This pulse must be capacitively coupled into the source chamber where the gas is to be excited to generate a plasma. This requires that there be some means of connecting the voltage pulse from outside the vacuum system directly into the source chamber. In systems in which the plasma is biased to kilovolts dc voltage to serve as the source for an ion beam, it is difficult or impossible in the prior art to safely provide such an external contact to the plasma.

Embodiments of the present invention provide an igniter for an inductively coupled plasma source for a charged particle beam system. This plasma igniter is preferably located near the inductively-coupled plasma (ICP) source to minimize the effects of cable capacitance between the igniter and the column. The output of the plasma igniter is a high voltage pulse which is efficiently coupled into the plasma chamber through an electrode which will be in contact with the plasma once it is ignited. A plasma sensor controls the plasma igniter, determining when a plasma has been initiated and then ceasing plasma igniter operation. The plasma igniter is housed in a high voltage safety enclosure and is biased by the same biasing power supply which controls the energy of the ions emitted by the ICP plasma source.

Figure 1:
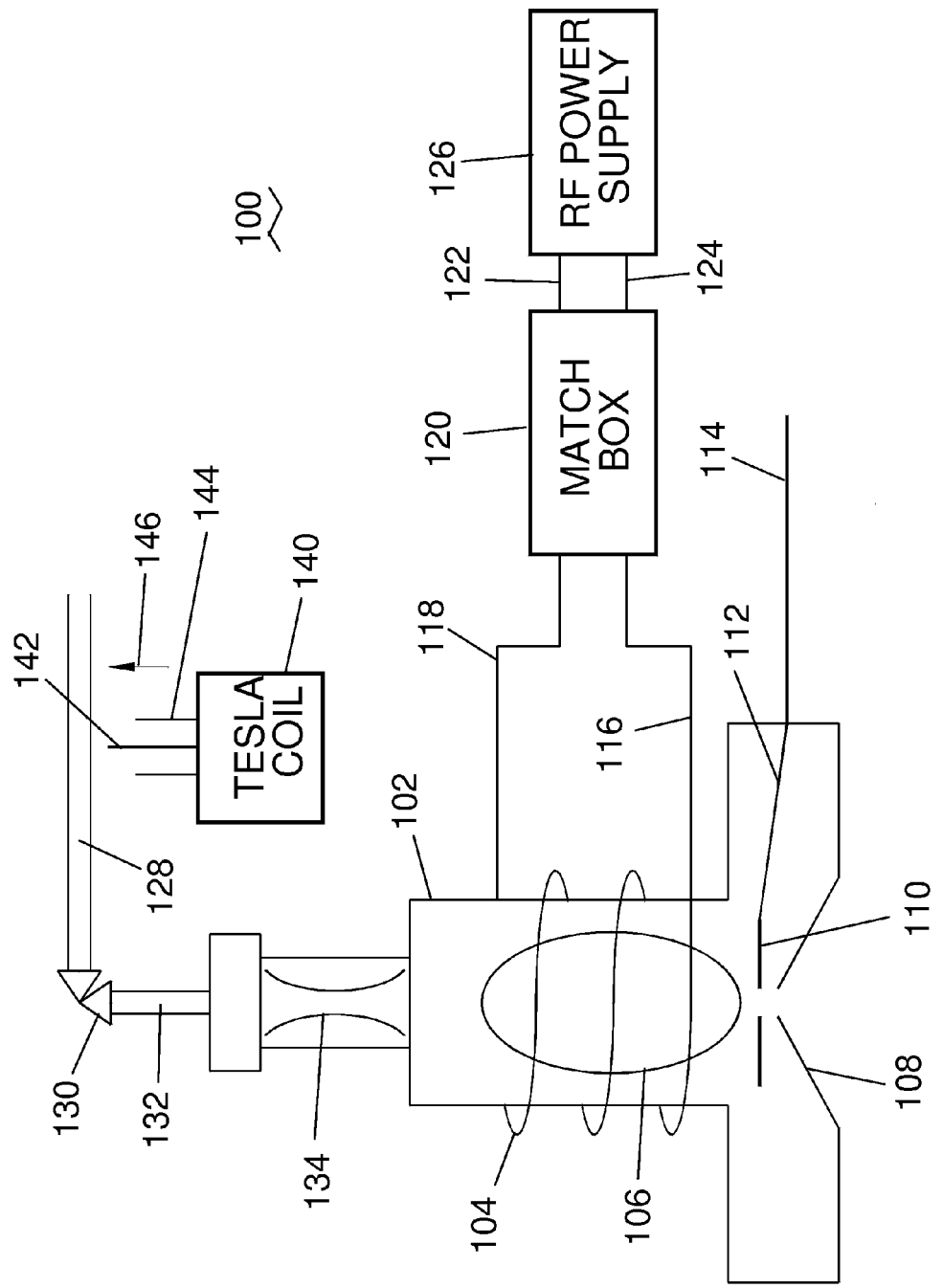
FIG. 1 shows a prior art method for igniting a plasma using a Tesla coil in two alternative locations on the exterior of the charged particle beam system.

FIG. 1 shows a prior art method for igniting a plasma comprising bringing a Tesla coil into contact with two alternative locations on the exterior of the charged particle beam system. The source chamber 102 may be an insulating vacuum enclosure fabricated from an insulating material such as ceramic, quartz, or Macor™ machinable ceramic. Requirements for optimum plasma containment in source chamber 102 include a low dielectric loss factor, high resistivity, vacuum compatibility, high thermal conductivity, and non-reactivity with the various feed gases used in plasma generation. Surrounding the source chamber 102 is an RF coil 104 connected to a match box 120 through electrical cables 116 and 118. Power from the RF supply 126 is coupled into the match box 120 by two electrical cables 122 and 124. Once even a small amount of ionization has been induced within the source chamber 102, an ionization cascade may progress, rapidly generating large numbers of free electrons and ions in the source chamber 102.

In FIG. 1, a prior art charged particle ICP source 100 is shown. Gas feed line 128 connects through a regulator valve 130 to the feed line 132 which conducts the gas to be ionized into a capillary 134. The capillary reduces the feed gas pressure to the level inside the source chamber 102, and then conducts the feed gas into the source chamber 102. If feed line 128, regulator valve 130 and feed line 132 form a continuous electrically conducting path from outside the vacuum into the interior of the source chamber 102, a Tesla coil 140 may be momentarily connected (arrow 146) to line 128 to ignite a plasma within source chamber 102. The central high voltage wire 142 of the Tesla coil is surrounded by an external shield 144 for safety. Once a plasma has been ignited, Tesla coil 140 would then be removed from contact with feed line 128.

The Source Biasing Electrode

In order to utilize the plasma generated in the ICP source 100 as a source for ions in a focused ion beam (FIB) system, it is necessary to be able to apply an accelerating voltage to the ions as they emerge from the plasma and enter the FIB column. In both the prior art shown in FIG. 1, and in the present invention, a source biasing electrode 110 may be employed to apply the accelerating voltage to the ions. In FIG. 1, at the bottom of the ICP source, a source biasing electrode 110 is illustrated. A key requirement for the proper operation of the source biasing electrode is that there be direct contact between the plasma in the plasma chamber and one surface of the source biasing electrode, in other words, the source biasing electrode must form part of the enclosure for the plasma in order to be able to apply a voltage to the ions extracted from the plasma. In the examples cited herein, the source biasing electrode forms the lower portion of the plasma enclosure, however, other locations for the source biasing electrode are functionally equivalent within the scope of the present invention. The source biasing electrode 110 is connected through interior cable 112 to an external cable 114 which leads to a biasing power supply (not shown). Below the source biasing electrode 110, an extractor electrode 108 is positioned as part of the ion extraction optics. This biasing supply controls the energies of the charged particles emitted from the ICP source relative to ground potential. If the sample is at ground, this will then determine the final beam energy at the sample.

Calculation of the Electrical Properties of the Source

FIG. 2A illustrates the effective capacitances of the source chamber 202 and source biasing electrode 208 in an inductively coupled plasma source 200. The exterior of the source chamber 202 is surrounded by a split Faraday shield 214 which is grounded by a cable 216 and which prevents the voltage on the RF coil 104 (see FIG. 1) from capacitively coupling to the plasma. This coupling, if not prevented by the Faraday shield 214, would induce undesirable voltage fluctuations on the plasma potential which would induce chromatic aberrations in the charged particle column, thereby blurring the beam at the sample. Capacitance 218 is between the Faraday shield 214 and the interior wall of the source chamber 202. Capacitance 220 is between the interior wall of the source chamber 202 and the source biasing electrode 208, which is connected to the beam acceleration power supply (not shown) by cable 210. Capacitance 228 is between the cable 210 and ground. The feed gas to be ionized is fed into the source chamber 202 through orifice 204. The ion beam extracted from the plasma in the source chamber 202 emerges through orifice 212. Capacitance 222 is below the source chamber where there is no plasma generation. Any currents flowing in capacitance 222 due to the RF power are not effective in generating a plasma, thus it is desirable to minimize capacitance 222 by the design of the ICP source. Once a plasma has been ignited in the source chamber 202, capacitance 220 is essentially shorted by the plasma.

FIG. 2B is a circuit diagram showing how the capacitances from FIG. 2A combine to form an effective source capacitance 250. Capacitances 220 and 218 are in series between the cable 210 and ground 216. Capacitances 222 and 228 appear in parallel with the series combination of capacitances 218 and 220. Thus the effective source capacitance 250 is:

$$C_{250}=C_{218}C_{220}/(C_{218}+C_{220})+C_{222}+C_{228},$$

where only capacitance 220 has any effect on igniting a plasma, since capacitances 218, 222, and 228 are outside the plasma region. The same current 240 flows through both capacitances 218 and 220. The total current, $I_{250}$, flowing through the effective source capacitance 250 is then:

$$I_{250}=I_{240}+I_{242}+I_{248}.$$

Since only the current $I_{240}$ is effective in triggering a plasma, the efficiency of the plasma igniter depends on the fraction, $F_{Current}$, of the total current, $I_{250}$, flowing through the capacitance $C_{220}$:

$$F_{Current}=I_{240}/I_{250}=I_{240}/(I_{240}+I_{242}+I_{248}).$$

The total voltage across the effective source capacitance, $V_{250}$, is then:

$$V_{250}=V_{218}+V_{220}=V_{222}=V_{228},$$

where voltage $V_{218}$ is across capacitor $C_{218}$, voltage $V_{220}$ is across capacitor $C_{220}$, voltage $V_{222}$ is across capacitor $C_{222}$, and voltage $V_{228}$ is across capacitor $C_{228}$. Capacitances 218 and 220 act as a capacitive voltage divider:

$$V_{218}=V_{250}(1/C_{218})/(1/C_{218}+1/C_{222}).$$

The next consideration is the power, $P_{Ignition}$, from the plasma igniter which is effective in igniting a plasma in the source region with capacitance 220:

$$P_{Ignition} = V_{220} I_{240}.$$

Obviously, for maximum plasma ignition efficiency, we want to maximize this power, $P_{Ignition}$, as a fraction of the total power, $P_{Total}$, from the plasma igniter:

$$P_{Total} = V_{250} I_{250}.$$

Thus the plasma igniter power efficiency fraction, $F_{Power}$, from the igniter that appears in the capacitance 220 where the plasma is to be ignited:

$$F_{Power} = P_{Ignition}/P_{Total} = V_{220} I_{240}/V_{250} I_{250}.$$

Clearly, then, in order to maximize the plasma igniter power efficiency fraction, $F_{Power}$, we want to maximize both the voltage, $V_{220}$, across capacitor 220 and the current, $I_{240}$, through capacitor 220. In order to maximize the voltage across capacitor 220, we want to minimize the voltage, $V_{218}$, across capacitor 218 which is in series with capacitor 220. To do this, it is necessary to maximize the value of capacitance 218, since the impendence of capacitor 218 goes as $(1/C_{218})$. This may be accomplished by making the insulating walls of the plasma chamber 202 as thin as possible, and also by maximizing the dielectric constant of the plasma chamber walls.

In order to maximize the current through capacitor 220, it is necessary to minimize the currents, $I_{222}$ and $I_{228}$, through capacitors 222 and 228, respectively. This may be accomplished by maximizing the impedances of capacitors 222 and 228. Since the impedances of capacitors 222 and 228 are proportional to $1/C_{222}$ and $1/C_{222}$, respectively, it is necessary to minimize the values of capacitances 222 and 228. For capacitance 222, capacitance minimization may be accomplished by proper design of the lower portion of the source, below the plasma region (see FIG. 2A). Reducing the areas and increasing spacings will both act to reduce $C_{222}$. For capacitance 228, capacitance minimization may be accomplished by using an open wiring instead of shielded cables wherever possible, keeping safety considerations in mind and by making the distances between the open wires and neighboring grounded surfaces as large as possible. This analysis of the derivation of the effective source capacitance, $C_{250}$, thus leads us to a design strategy for maximizing the power efficiency, $F_{Power}$, of the plasma igniter.

Figure 2:
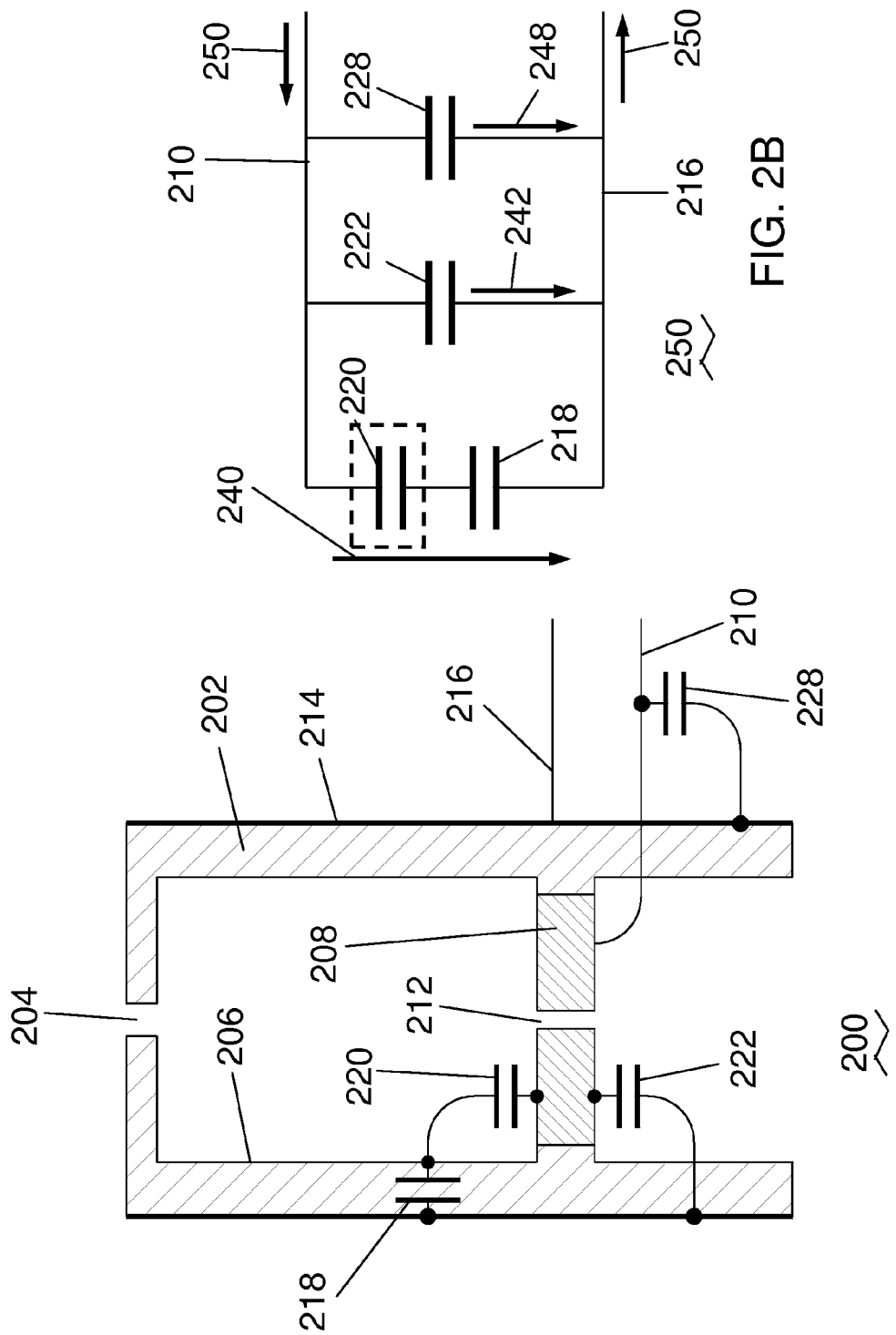
FIG. 2A illustrates the effective capacitances of the source chamber and source biasing electrode.
FIG. 2B is a circuit diagram of the effective capacitances illustrated in FIG. 2A.
Figure 3:
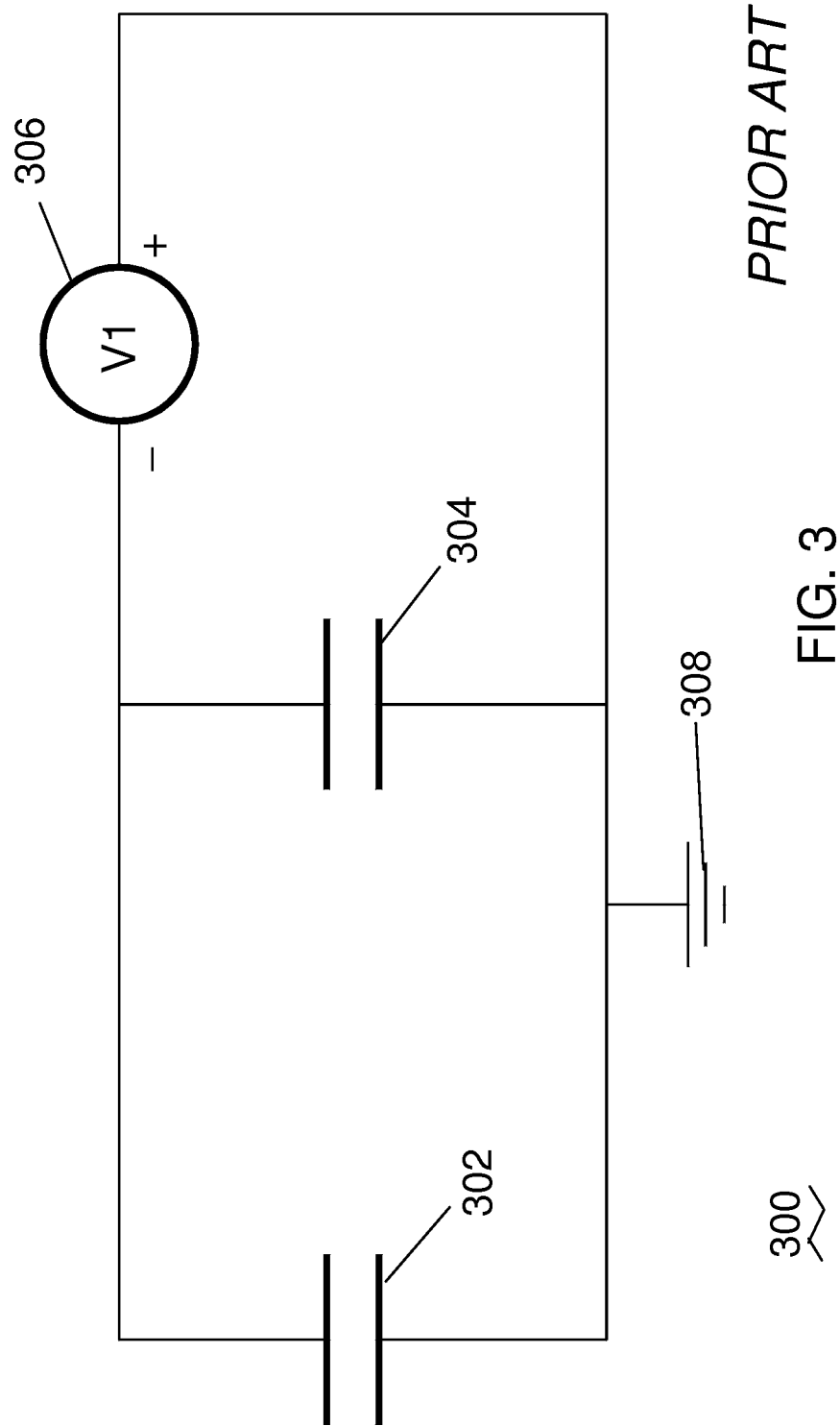
FIG. 3 is a simplified electrical schematic diagram of a prior art plasma ignition circuit.
Figure 7:
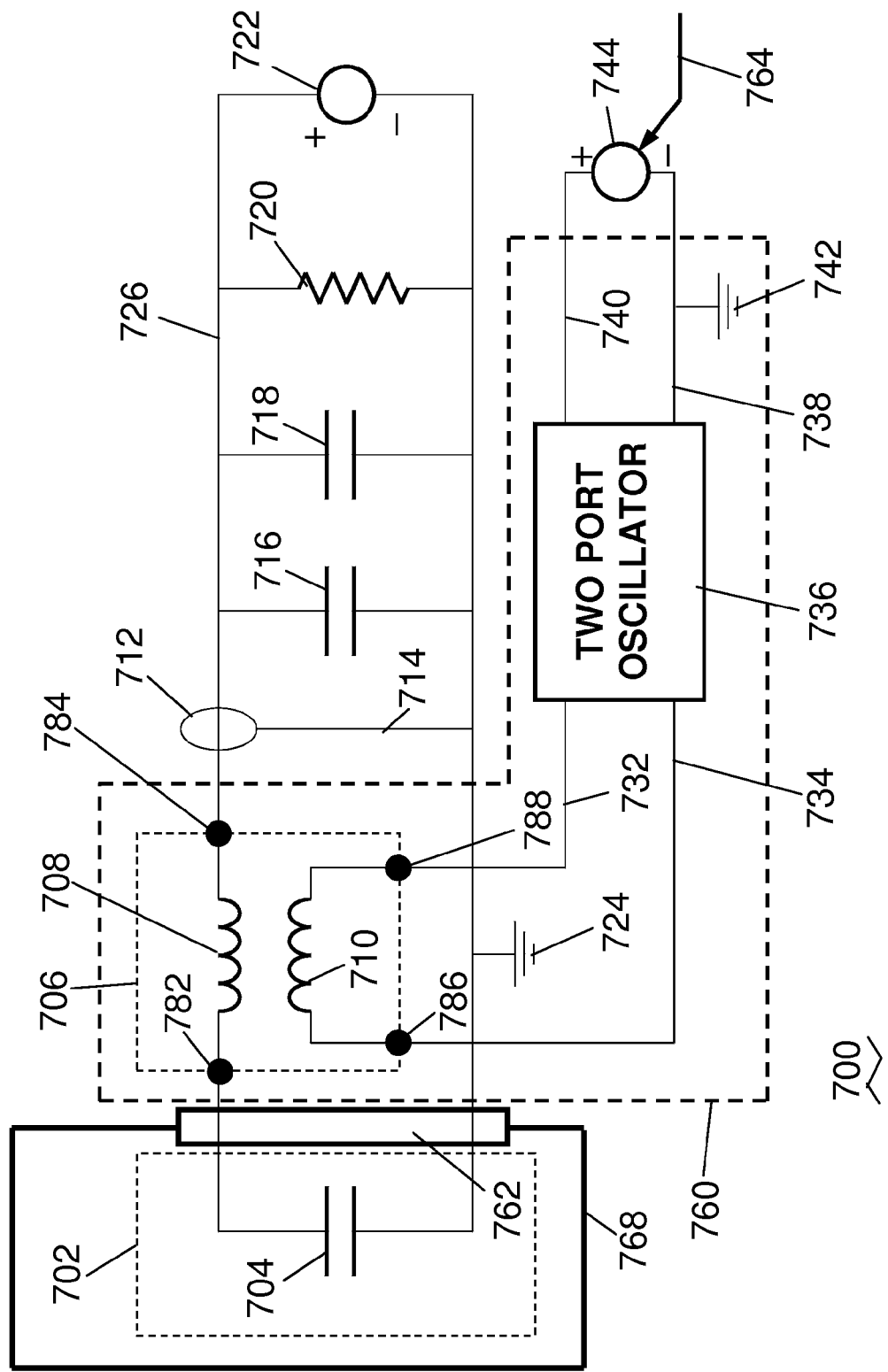
FIG. 7 is a first exemplary electrical circuit for a plasma igniter according to the present invention.
Figure 8:
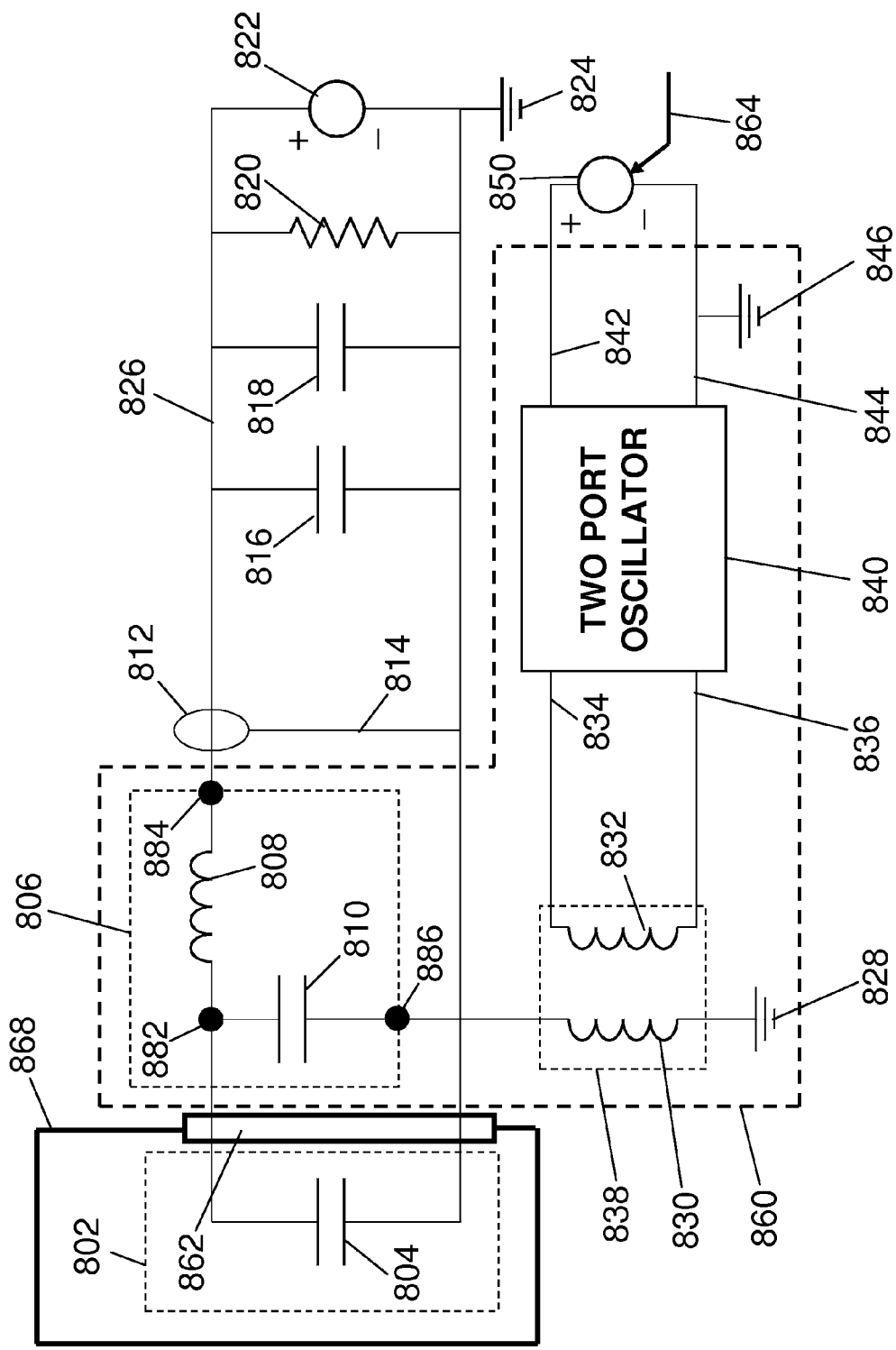
FIG. 8 is a second exemplary electrical circuit for a plasma igniter according to the present invention.

FIG. 3 is a simplified electrical schematic diagram 300 of a prior art plasma ignition circuit. The plasma igniter 306 is shown located away from the charged particle beam system employing the ICP source. Capacitance 302 corresponds to the internal capacitance of the source:

$$C_{302} = C_{222} + C_{218} C_{220}/(C_{218} + C_{220}),$$

where capacitances 218, 220 and 222 are from FIG. 2. This equation shows that capacitance 222 is in parallel with the series combination of capacitances 218 and 220. Any current in capacitance 222 thus can be seen to be taken away from the currents in capacitances 218 and 220 which are effective in igniting the plasma in the source chamber 202 in FIG. 2. Capacitance 304 is the cable capacitance between the plasma igniter 306 and the source chamber 202 in FIG. 2. Any currents in capacitance 304 are drawn away from the currents in capacitance 302 which go to the source:

$$I_{302} = (dV1/dt) C_{302}/(C_{302} + C_{304}),$$

where V1 represents the voltage on the secondary winding of the transformer used to couple the output of the plasma igniter into the source chamber—see FIGS. 7 and 8 for representative circuits illustrating this transformer coupling. The prior art circuit is referenced to ground 308.

FIG. 3 thus illustrates the problem with prior art plasma ignition methods employing igniters located at a distance from the plasma source—a potentially large amount of the intended plasma ignition current may be siphoned away by the cable capacitance 304 and by any stray capacitances (such as capacitance 222 in FIG. 2) within the source which are outside the plasma region. The plasma ignition voltage must be increased to compensate for these losses, potentially leading to higher costs and inferior plasma ignition capabilities. For a source capacitance 302 of 25 pf and a cable capacitance of 500 pf, an output from the plasma igniter of 10 kV at 125 kHz was required, representing 4 A across the cable capacitance 304. Capacitances 302 and 304 thus appear in parallel across the output of the plasma igniter, with the larger cable capacitance 304 drawing proportionately more current than the smaller source capacitance 302. Since the ratio of capacitance 302 (25 pf) to the total capacitance (525 pf) is (25 pf)/(525 pf), only approximately 5% of the output current of the plasma igniter 306 is effective in plasma ignition.

Figure 4:
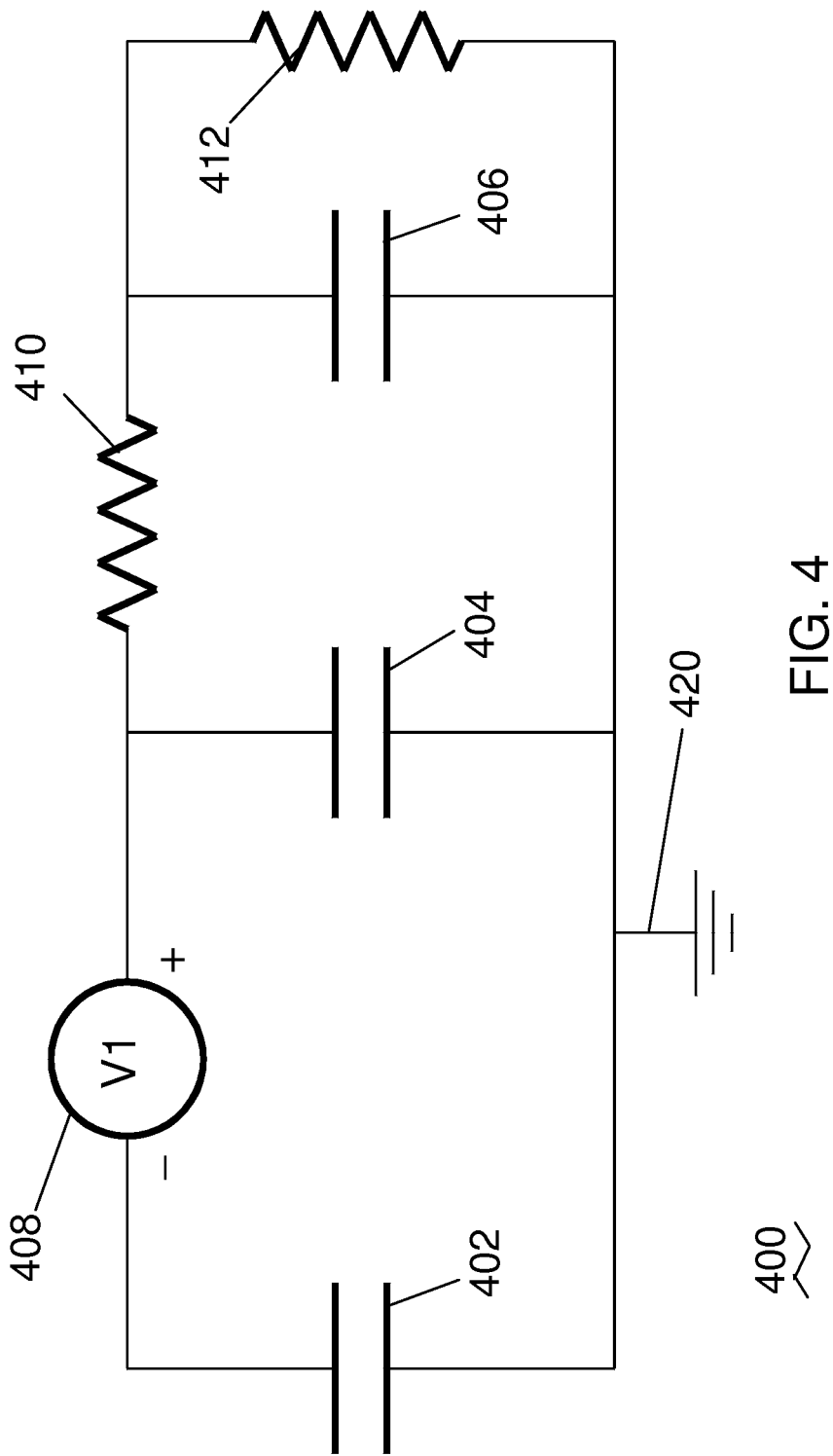
FIG. 4 is a simplified electrical schematic diagram of a plasma igniter near the charged particle column as in the present invention.

FIG. 4 is a simplified electrical schematic diagram 400 of a plasma igniter 408 located near the charged particle column as in the present invention. Again, capacitance 402 corresponds to the internal capacitance of the source:

$$C_{402} + C_{222} + C_{218} C_{220}/(C_{218} + C_{220}),$$

where capacitances 218, 220 and 222 are again from FIG. 2 and capacitance 222 is in parallel with the series combination of capacitances 218 and 220. Any current in capacitance 222 thus can be seen to be taken away from the currents in capacitances 218 and 220 which are effective in igniting the plasma in the source chamber 202 in FIG. 2. In the present invention, the plasma igniter 408 is located at or very near to the vacuum enclosure of the charged particle beam system employing the ICP source. Thus, the capacitance 404 of the cable connecting to the plasma biasing supply now appears in series with the source capacitance 402, instead of parallel as in the prior art in FIG. 3, thus the great majority of the voltage drop induced by the output, V1, of the plasma igniter 408 will appear across the source capacitance 402 instead of the cable capacitance 404.

Impedance 410 corresponds to the internal resistivity ("dumping resistor") of the biasing voltage supply. Capacitance 406 is the output capacitance of the biasing voltage supply, with a leakage resistance 412. Capacitance 404 is the cable capacitance between the plasma igniter 306 and the source chamber 202 in FIG. 2. V1 represents the voltage on the secondary winding of the transformer used to couple the output of the plasma igniter into the source chamber—see FIGS. 7 and 8 for representative circuits illustrating this transformer coupling. The circuit is referenced to ground 420.

For a capacitance 402 of 25 pf and capacitance 404 of 500 pf, as in FIG. 3, then the output voltage V1 of the secondary winding of the transformer will be divided in the inverse ratio of the capacitances, thus more than 95% of V1 will appear across capacitance 402:

$$V_{402} = V1 C_{402}/(C_{402} + C_{404})$$

Figure 5:
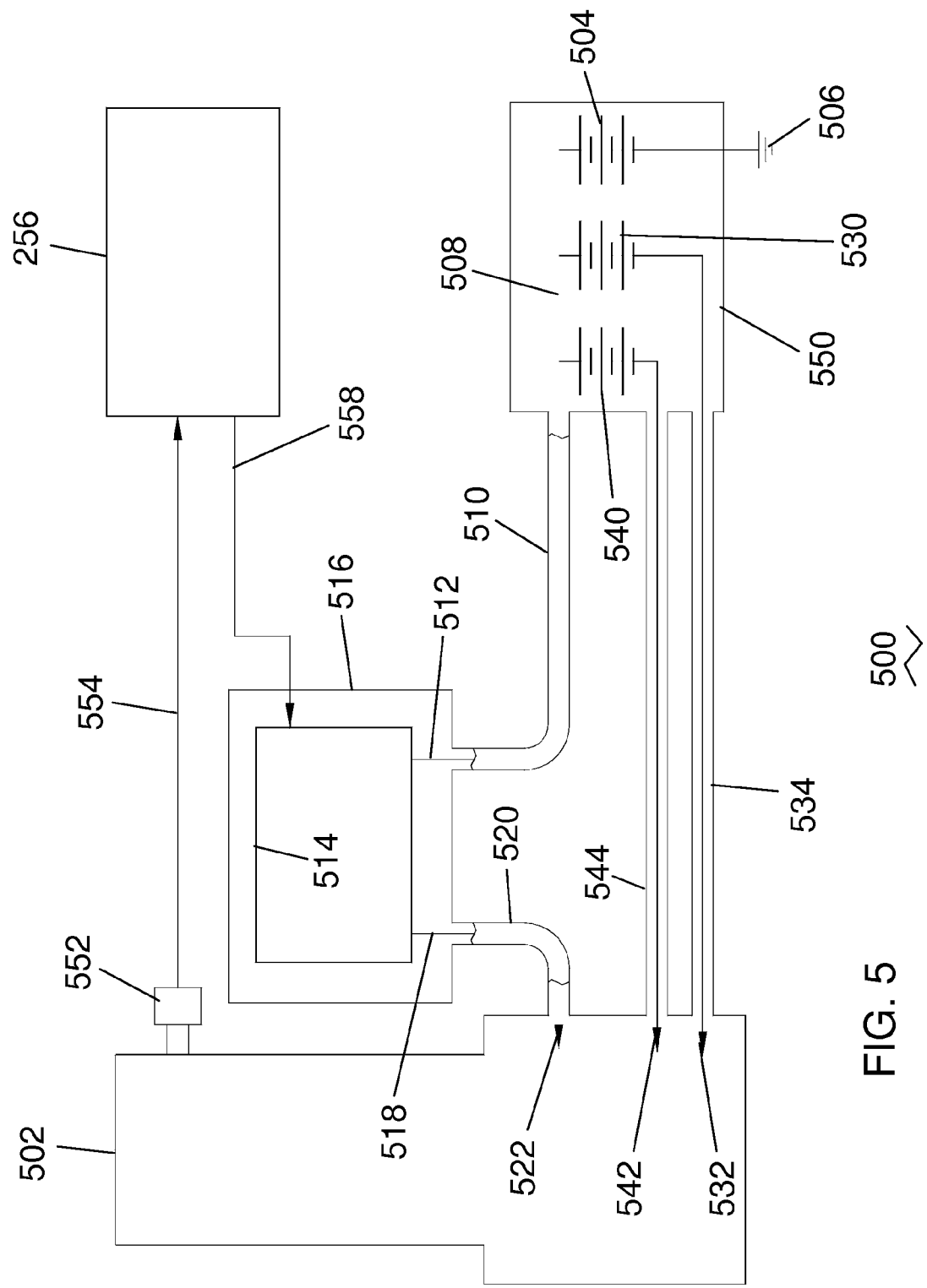
FIG. 5 is a diagram of a charged particle beam system employing an in-line plasma igniter of the present invention.

FIG. 5 is a diagram of a charged particle beam system 500 employing an in-line plasma igniter of the present invention. A vacuum enclosure 502 contains a charged particle column (not shown). At the top of the enclosure is a plasma sensor 552. Multiple methods for detecting the presence of a plasma are possible, including, for example, 1) the light from the plasma, 2) the drop in impedance due to ionization, 3) the change in the optimal tuning parameters in the RF match box, and 4) the temperature in the source chamber. When a plasma has been ignited, the dc bias voltage on cable 522 is equal to the output of biasing power supply 504, referenced to ground 506. The output 508 of bias power supply 504 is connected through shielded cable 510 to the input 512 of the plasma igniter 514, enclosed in safety housing 516. Thus, plasma igniter 514 may be biased to the high voltage output of biasing power supply 504 with no safety concern to the system operator. The output 518 of the plasma igniter 514 is connected through shielded cable 520 to interior cable 522 which connects to the source biasing electrode (not shown—see electrode 110 in FIG. 1). The plasma igniter 514 is preferably permanently physically connected to the cable 522, that is, it is not momentarily contacted and removed as a Tesla coil would be. While the plasma igniter 514 is permanently physically connected to the source biasing electrode, it can be electrically isolated, such as by a switch or software. The physical connection is "permanent" during normal use, but can be disconnected for maintenance. After the plasma has been ignited, the high voltage from supply 504 connects through the plasma igniter 514 to the source biasing electrode. Optionally, during plasma ignition, the high voltage output from supply 504 can be added to the pulsed high voltage from the plasma igniter 514 with the combined voltage going through interior cable 522 to the source biasing electrode (not shown).

An extractor electrode (not shown) is connected and biased by power supply 540 through shielded exterior cable 544 to interior cable 542. A condenser electrode (not shown) is biased by power supply 530 through shielded cable 534 to interior cable 532. Both power supplies 530 and 540 are referenced to the high voltage output of power supply 504.

The output from the plasma sensor is conducted to the logic circuitry 256 through signal line 554. Based on the signals from plasma detector 552, the logic circuitry 256 controls the plasma igniter 514 through control line 558. In general, the logic circuitry will activate the plasma igniter 514 until either a plasma has been initiated or the logic circuitry concludes that there is a defect which makes plasma initiation impossible.

The igniter 514 is preferably part of a module such as those shown in FIGS. 7 and 8. A coupling network (FIG. 8) or high voltage transformer (FIG. 7) in the module selectively applies either the ignition voltage, the biasing voltage from biasing power supply, or both simultaneously. The length of the cable 520 from the igniter to the electrode is preferably less than 100 cm, more preferably less than 30 cm, and most preferably less than 15 cm. As discussed in FIG. 2B, above, the shorter cable 520, the lower its capacitance and the less power is required to deliver sufficient power through the cable to ignite the plasma. Also as discussed in FIG. 2B, it may be preferable that cable 520 is an open wire, not a shielded cable, in order to further reduce capacitance. The length of cable 510 is preferable less than 1000 cm, more preferably less than 500 cm, and most preferably less than 300 cm.

Plasma Igniter Pulsed Voltage Waveform

Figure 6:
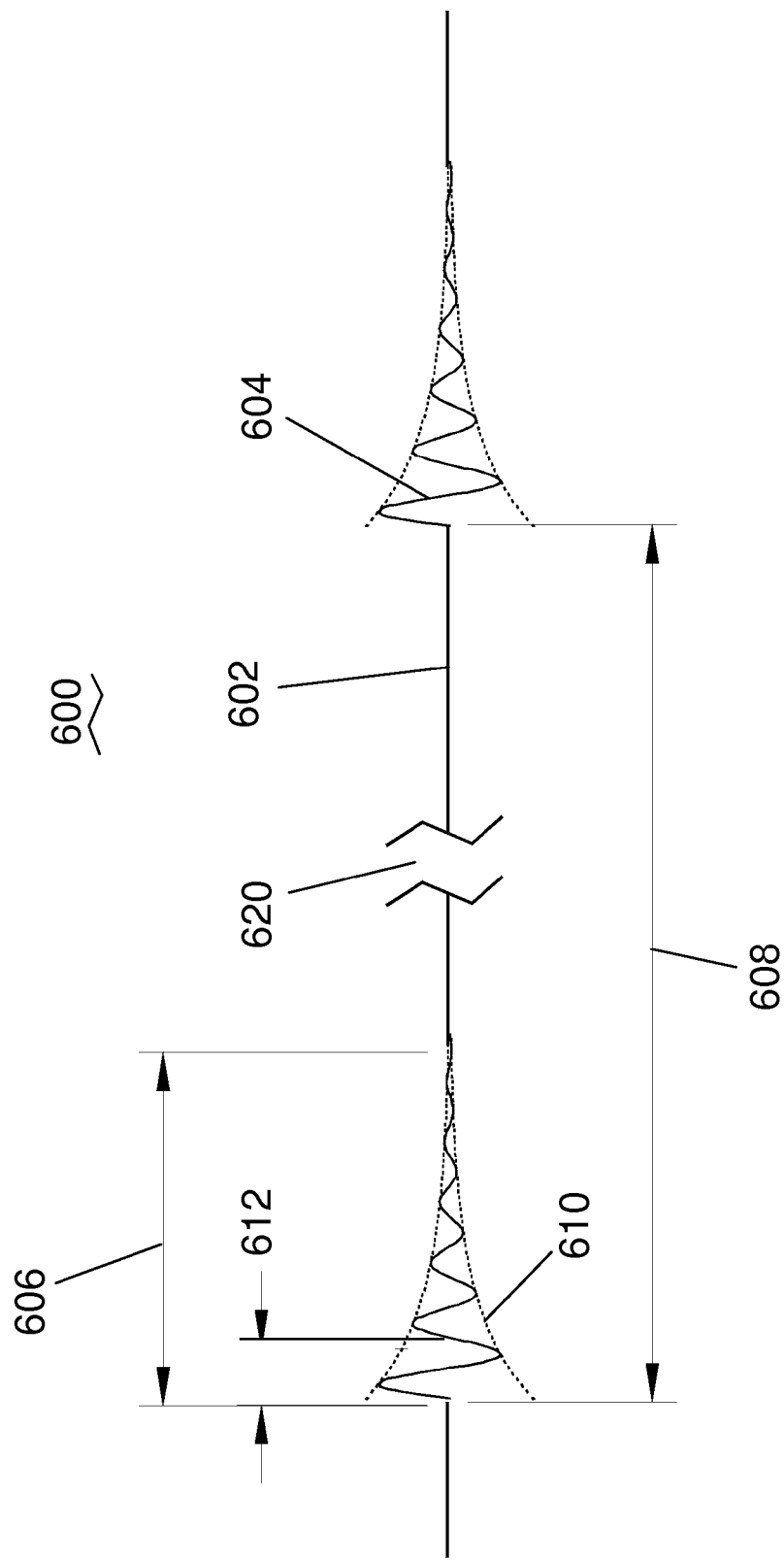
FIG. 6 shows the pulsed voltage waveform used by the present invention to ignite a plasma in the ICP source.

FIG. 6 shows the pulsed voltage waveform 600 used by the present invention to ignite a plasma in the ICP source. An oscillatory high voltage waveform 604 has a typical period 612 in the range 500 to 2 µs (2 to 500 kHz), with a preferred period in the range 10 to 3.33 µs (100 to 300 kHz). The oscillatory waveforms have a repetition rate 608 of roughly 100 Hz. To achieve a maximum plasma ignition voltage with reduced total power, a decaying 610 oscillatory waveform is used with an overall oscillatory period 606 in the range of 70 to 100 µs. The oscillatory period 606 is shown exaggerated with respect to the repetition period 608, as indicated by the break 620. In between oscillations, the output of the plasma igniter is 0 V, 602. Typical initial peak to peak voltages for the oscillatory waveforms are generally at least 1 kV, ranging up to 20 kV. A benefit of the decaying oscillatory pulse illustrated in FIG. 6 is that the initial voltage is maximized, while the total power per pulse is minimized by the decrease in voltage with the later cycles of the oscillation.

First Embodiment of the Invention

FIG. 7 is a first exemplary electrical circuit for a plasma igniter according to the present invention. An inductively coupled ion source 702 has a capacitance 704, corresponding to capacitance 402 in FIG. 4. A high voltage isolation transformer 706 is mounted at or near to the ion source 702 at the exterior of a vacuum enclosure 768 containing the ion source 702 and having a vacuum feedthrough 762. Transformer 706 comprises a ground-referenced primary winding 710 and an isolated high voltage secondary winding 708. Primary winding 710 has a first connection point 786 and a second connection point 788. Secondary winding 708 has a first connection point 782 and a second connection point 784. Connection point 782 connects to the ion source 702 through vacuum feedthrough 762 in vacuum enclosure 768. The beam energy is set by the dc bias supply 722 with internal resistance 720 and output capacitance 718. The cable 726 between the dc bias supply 722 and the isolation transformer 706 has a capacitance 716 and a shield 712 referenced through electrical connection 714 to ground 724. Cable 726 is connected to connection point 784 of secondary winding 708. Connection point 782 connects the output of the secondary winding 708 to the ion source 702. Since the bias supply 722 has a dc output, the dc bias voltage generated by dc bias supply 722 passes through the secondary winding 708 with only a minor resistive voltage drop between connection points 784 and 782.

A two-port oscillator 736 has a power supply 744 connected through wires 740 and 738, and is referenced to ground 742. The output of oscillator 736 is connected to the primary winding 710 of high voltage isolation transformer 706 through wires 732 and 734, which connect to primary winding 710 at connection points 788 and 786, respectively. An RF high voltage waveform, such as that illustrated in FIG. 6, is then inductively-coupled from the primary winding 710 into the secondary winding 708. The induced RF voltage on secondary winding 708 corresponds to voltage V1 in FIG. 4. The induced RF voltage on secondary winding 708 is coupled to the ion source 702 through connection point 782. A grounded safety enclosure 760 surrounds the two port oscillator 736 and transformer 760, as shown. The two port oscillator 736 is controlled by turning the power supply 744 on or off, based on a control signal received on line 764 from logic circuitry (not shown), such as logic circuitry 256 illustrated in FIG. 5. While power supply 744 is on, the two port oscillator 736 will generate a continuous pulsed waveform as shown in FIG. 6.

Second Embodiment of the Invention

FIG. 8 is a second exemplary electrical circuit for a plasma igniter according to the present invention. An inductively coupled ion source 802 has a capacitance 804, corresponding to capacitance 402 in FIG. 4. A high voltage coupling network 806 is mounted at or near to the ion source 802, at the exterior of a vacuum enclosure 868 containing the ion source 802, and having a vacuum feedthrough 862. The coupling network 806 comprises a high voltage choke 808 and a high voltage capacitor 810. High voltage choke 808 has a first connection point 884 and a second connection point 882. High voltage capacitor 810 has a first connection point 886 and a second connection point 882. Connection point 882 connects to the ion source 802 through vacuum feedthrough 862 in vacuum enclosure 868. The beam energy is set by the dc bias supply 822 with internal resistance 820 and output capacitance 818. The cable 826 between the dc bias supply 822 and the coupling network 806 has a capacitance 816 and a shield 812 referenced through electrical connection 814 to ground 824. Cable 826 is connected to connection point 884 of high voltage choke 808. Connection point 882 connects the output of the high voltage choke 808 to the ion source 802. Since the bias supply 822 has a dc output, the dc bias voltage generated by d bias supply 822 passes through the high voltage choke 808 with only a minor resistive voltage drop between connection points 884 and 882.

A two-port oscillator 840 has a power supply 850 connected through wires 842 and 844, and is referenced to ground 846. The output of oscillator 840 is connected to the primary winding 832 of transformer 838 through wires 834 and 836. A high voltage pulse, such as that illustrated in FIG. 6, is then inductively-coupled to the secondary winding 830 of transformer 838. The induced RF voltage on secondary winding 830 is coupled through connection point 886. The RF voltage at connection point 886 is then capacitively-coupled through high voltage capacitor 810 to connection point 882 and then to ion source 802. The induced voltage on secondary winding 830 corresponds to voltage V1 in FIG. 4. A grounded safety enclosure 860 surrounds the two port oscillator 840, transformer 838, and coupling network 806 as shown. The two port oscillator 840 is controlled by turning the power supply 850 on or off, based on a control signal received on line 864 from logic circuitry (not shown), such as logic circuitry 256 illustrated in FIG. 5. While power supply 850 is on, the two port oscillator 840 will generate a continuous pulsed waveform as shown in FIG. 6.

Focused Ion Beam System Employing the Plasma Igniter of the Invention

Figure 9:
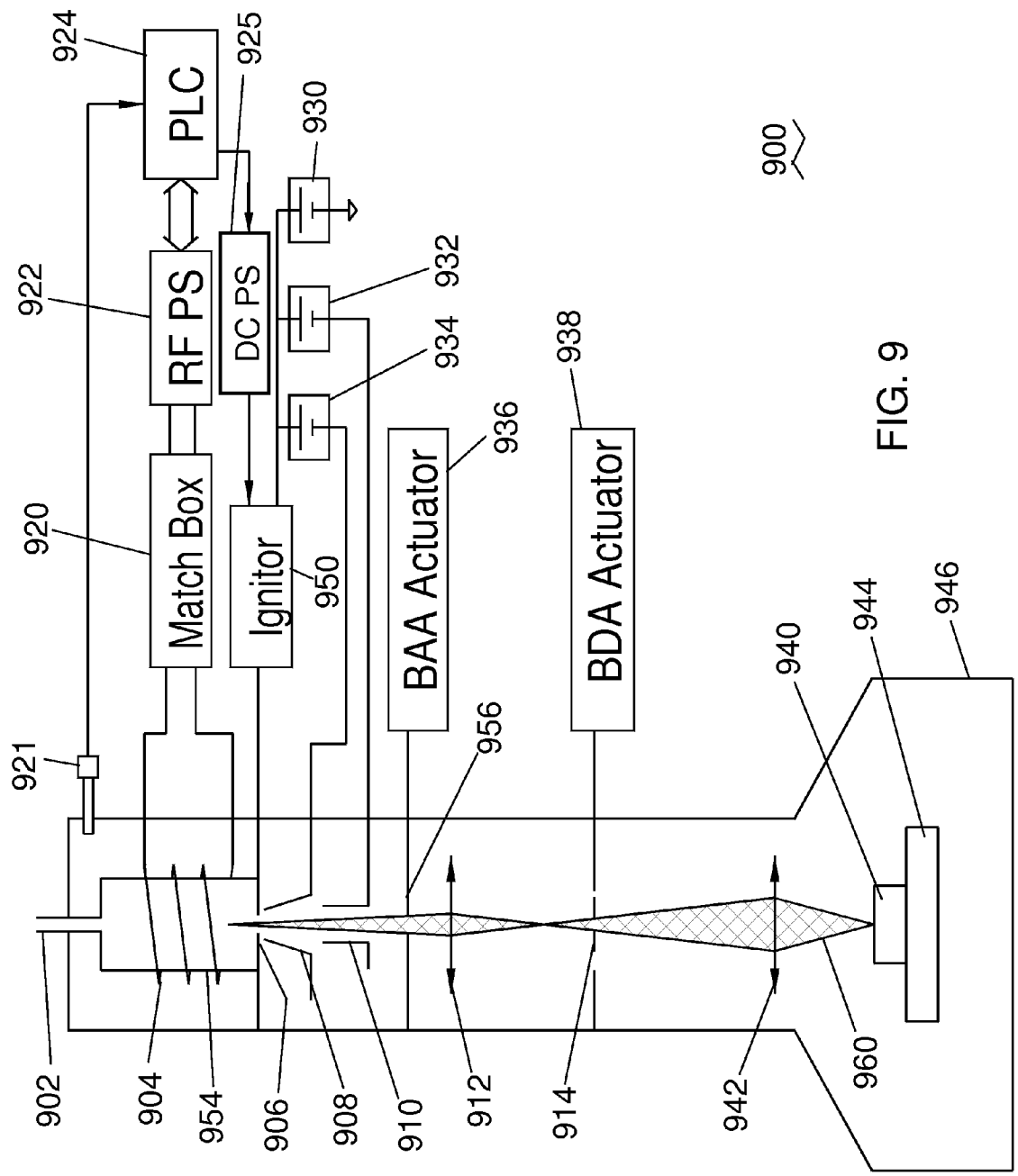
FIG. 9 is a schematic diagram of a focused ion beam (FIB) column embodying a plasma igniter of the present invention.

FIG. 9 is a schematic diagram of a focused ion beam (FIB) system 900 of the present invention embodying a plasma igniter 950 with a power supply 925. An RF power supply 922 supplies RF power to a match box 920 which is connected to an antenna 904 which surrounds a plasma chamber 954 within which a plasma is generated. A feed gas to be ionized is fed into the plasma chamber 954 through a feed system 902. A biasing power supply 930 is connected through a plasma igniter 950 to a source biasing electrode 906 in the focused ion beam (FIB) column. An extractor electrode 908 in the FIB column is biased by a power supply 934, referenced to the output voltage of the biasing power supply 930. A condenser electrode 910 in the FIB column is biased by a power supply 932, referenced to the output voltage of the biasing power supply 930.

Ions are extracted from the plasma contained in the plasma chamber 954 due to the high electric field induced at the lower end of the plasma chamber 954 by the bias voltage on the extractor electrode 908 relative to the voltage on the source biasing electrode 906. The ions extracted from the plasma chamber 954 emerge downwards through the opening in the source biasing electrode 906, forming an ion beam which enters the FIB column. Thus, the plasma at the lower end of the plasma chamber 954 serves as a "virtual source" for the FIB column. In general, a large portion of the ion beam going down the FIB column strikes one or more apertures in the column, such as apertures 906, 956, or 914. Because of the high mass and energy of the ions in the ion beam striking the apertures, erosion of apertures is a significant concern. Thus, the present invention comprises a number of aperture compositions that have low sputtering rates. Examples of materials which are most desirable for apertures include machinable carbon-based compounds, beryllium, vanadium, titanium, scandium, silicon, and niobium. Also included would be materials in which one or more of these elements or compounds comprise a major constituency of the overall material composition. Since the major area of aperture erosion tends to be the bore of the apertures where the incidence angle of the beam is far from normal to the local surface (i.e., the beam strikes the bore of the aperture at a "glancing" angle), aperture materials with low sputtering rates at non-normal incidence angles are of particular value. In the FIB column of FIG. 9, three apertures are shown: 1) an aperture in the source biasing electrode 906, 2) a beam acceptance aperture (BAA) 956, and 3) a beam defining aperture (BDA) 914. All three apertures 906, 956, and 914 are subject to the sputter erosion concerns addressed by the aperture material selection of the present invention.

The position of the beam acceptance aperture 956 is controlled by the beam acceptance aperture actuator 936. The position and choice of beam defining aperture 914 is controlled by the beam defining aperture actuator 938. Two lenses 912 and 942 are shown forming a focused ion beam 960 on the surface of a sample 940 supported and moved by a sample stage 944 within a vacuum enclosure 946.

The presence or absence of a plasma in the plasma chamber 954 is detected by a plasma detector 921. The signal from the plasma detector 921 is fed to the logic circuitry 924 as discussed in FIG. 5. The logic circuitry 924 controls the plasma igniter power supply 925, which, in turn, controls the plasma igniter 950 as discussed in FIGS. 7 and 8, above.

The details of the plasma igniter circuits illustrated in FIGS. 7 and 8 are for exemplary purposes only—many other plasma igniter circuits are possible within the scope of the present invention. The waveform illustrated in FIG. 6 is also for exemplary purposes only—other waveforms are possible within the scope of the present invention.

A preferred method or apparatus of the present invention has many novel aspects, and because the invention can be embodied in different methods or apparatuses for different purposes, not every aspect need be present in every embodiment. Moreover, many of the aspects of the described embodiments may be separately patentable or patented. For example, the types of low sputter materials used for the apertures and the dielectric material used for the plasma chamber may be separately patentable.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A focused ion beam system, comprising:
an inductively coupled plasma ion source;
a source biasing electrode at the plasma ion source;
an electrical connection to the source biasing electrode;
a focused ion beam column, configured to focus an ion beam at the sample;
a source biasing power supply having a dc voltage output;
a first circuit coupling the dc voltage from the source biasing power supply to the source biasing electrode;
one or more lenses; and
a plurality of apertures, wherein one or more apertures within the plurality of apertures has a material composition selected for low sputtering, the material composition comprising one or more of the following: carbon-based compounds, beryllium, vanadium, titanium, scandium, silicon, or niobium.

2. The focused ion beam system of claim 1, further comprising a plasma sensor for detecting the presence of a plasma within the ion source.

3. The focused ion beam system of claim 2, further comprising:
logic circuitry electrically connected to receive a signal from the plasma sensor; and
an electrical control connection from the logic circuitry to the plasma igniter.

4. The focused ion beam system of claim 3 wherein the logic circuitry is configured to control the plasma igniter based on a signal from the plasma detector.

5. The focused ion beam system of claim 1, further comprising a vacuum enclosure, wherein the vacuum enclosure contains the inductively coupled plasma ion source, and wherein the plasma igniter is mounted at or near the exterior of the vacuum enclosure 6. The focused ion beam system of claim 1, wherein the inductively coupled plasma ion source further comprises:
an insulating plasma chamber;
an RF antenna surrounding the plasma chamber;
a match box electrically connected to the RF antenna;
an RF power supply electrically connected to the match box; and
a gas feed system configured to supply a feed gas for ionization into the plasma chamber.

7. The focused ion beam system of claim 1 wherein the plasma chamber includes an insulating plasma chamber comprising one or more of the following: ceramic, quartz, or machinable ceramic.

8. The focused ion beam system of claim 1, further comprising:
a plasma igniter having a pulsed voltage waveform; and
a second circuit coupling the pulsed voltage waveform from the plasma igniter to the source biasing electrode.

9. A method of processing a sample with a focused ion beam system having an inductively couple plasma ion source, the method comprising:
extracting ions from a plasma chamber of an inductively coupled plasma ion source;
forming an ion beam from the extracted ions;
directing the ion beam toward the sample, the ion beam striking a plurality of apertures before making contact with the sample, wherein one or more apertures within the plurality of apertures has a material composition selected for low sputtering, the material composition comprising one or more of the following: carbon-based compounds, beryllium, vanadium, titanium, scandium, silicon, or niobium.

10. The method of claim 9 in which extracting ions from the plasma chamber comprises coupling a pulsed voltage waveform from a plasma igniter to the source biasing electrode to induce a high electric field at the lower end of the plasma chamber.

11. The method of claim 9 further comprising detecting the presence of a plasma within the ion source.

12. The method of claim 9 further comprising receiving a signal from a plasma sensor using electrically connected logic circuitry.

13. The method of claim 12 wherein the logic circuitry is configured to control the plasma igniter based on a signal from a plasma detector.

14. The method of claim 9, where in the focused ion beam system comprises a vacuum enclosure, wherein the vacuum enclosure contains the inductively coupled plasma ion source, and wherein the plasma igniter is mounted at or near the exterior of the vacuum enclosure.

15. The method of claim 9 wherein the inductively coupled plasma ion source comprises:
an insulating plasma chamber;
an RF antenna surrounding the plasma chamber;
a match box electrically connected to the RF antenna;
an RF power supply electrically connected to the match box; and
a gas feed system configured to supply a feed gas for ionization into the plasma chamber.

16. The method of claim 9 wherein the plasma chamber comprises one or more of the following: ceramic, quartz, or machinable ceramic.

17. The method of claim 9, wherein the plurality of apertures comprises an aperture in a source biasing electrode, a beam acceptance aperture, and a beam defining aperture.

18. The method of claim 17, wherein the position of the beam acceptance aperture is controlled by a beam acceptance actuator and the position of the beam defining aperture is controlled by a beam defining actuator.

* * * * *